(12) United States Patent
Negi et al.

(10) Patent No.: US 6,818,885 B2
(45) Date of Patent: Nov. 16, 2004

(54) PHOTODETECTOR

(75) Inventors: Yasuharu Negi, Hamamatsu (JP); Toru Hirohata, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/703,160

(22) Filed: Nov. 7, 2003

(65) Prior Publication Data

US 2004/0135071 A1 Jul. 15, 2004

(30) Foreign Application Priority Data

Nov. 13, 2002 (JP) ..................................... P2002-329743

(51) Int. Cl.$^7$ .............................. H01J 40/14; H01J 5/02
(52) U.S. Cl. ..................... 250/239; 250/370.15; 313/11
(58) Field of Search .............................. 250/239, 208.1, 250/214 VT, 338.1, 370.15, 238; 313/11, 41, 46, 364; 257/930

(56) References Cited

U.S. PATENT DOCUMENTS

| | | | |
|---|---|---|---|
| 4,464,572 A | * | 8/1984 | Hirschfeld ............... 250/338.1 |
| 5,485,005 A | * | 1/1996 | Aikens ................. 250/214 VT |
| 6,573,640 B1 | * | 6/2003 | Hakamata et al. ............ 313/39 |

FOREIGN PATENT DOCUMENTS

| JP | HEI 05-312638 | 11/1993 |
|---|---|---|
| JP | HEI 06-088747 | 3/1994 |
| JP | HEI 10-041490 | 2/1998 |

* cited by examiner

*Primary Examiner*—Thanh X. Luu
*Assistant Examiner*—Seung C. Sohn
(74) *Attorney, Agent, or Firm*—Morgan, Lewis & Bockius LLP

(57) ABSTRACT

The invention relates to a photodetector capable of detecting even weak light with precision and having a structure permitting size reduction. In the photoelectric tube, a photoelectric tube is cooled down starting from a light receiving faceplate side via a supporting protrusion piece of a heat conductive supporting member fixed to the heat absorbing portion of a cooling device by the heat absorbing operation of the cooling device. At this time, the photoelectric tube is fixed only to the supporting protrusion piece, so that heat inflow through other members is prevented. Thus, the photoelectric surface is efficiently cooled down through the light receiving faceplate by the cooling device serving as a cooling source, so that a stable cooling temperature is obtained. This suppresses the emission of thermal electrons from the photoelectric surface, and hence sufficiently suppresses the occurrence of noise in the photoelectric tube. In this state, light to be measured that is transmitted through the light entrance window of the housing is incident on the photoelectric surface of the photoelectric tube via an aperture stop of the supporting protrusion piece, while background light emitted from the housing is shielded by the supporting protrusion piece around the aperture stop so as not to be incident on the photoelectric surface.

16 Claims, 5 Drawing Sheets

PHOTODETECTOR

BACKGROUND OF THE INVENTION

1. Field of the Invention

The present invention relates to a cooling type photodetector in which at least a cooling device is built inside a housing for accommodating a photoelectric tube.

2. Related Background Art

A cooling type photodetector of this kind is disclosed, for example, in Japanese Patent Laid-Open No. 6-88747 (Reference 1), which describes the configuration of a cooling type photodetector comprising a cooling device composed of a Peltier element, and an annular cooling block attached to the low temperature side (heat absorbing portion) of the cooling device, both being built inside a box for accommodating a photomultiplier. Further, Japanese Patent Laid-Open No. 5-312638 (Reference 2) discloses the configuration of an infrared optical apparatus comprising an infrared image detector, a cooling device composed of a Peltier element, and a cooling framework attached to the heat absorbing side (heat absorbing portion) of the cooling device, all being built inside a lens barrel of an optical system for forming an infrared image.

In the the cooling type photodetector described in Reference 1, the annular cooling block surrounds and cools down one end portion on the photoelectric surface side of a photomultiplier and one end portion of a vacuum cell type light entrance window facing the photomultiplier. The portion of the photomultiplier other than the one end portion is supported within the box via a heat insulating material, and the other end portion of the vacuum cell type light entrance window is supported such as to be fitted into a wall portion of the box. Then, the other end portion of the vacuum cell type light entrance window is heated through the wall portion of the box by a heat radiating plate to which a high temperature side (heat radiating portion) of the cooling device is attached.

On the other hand, in the infrared optical apparatus described in Reference 2, an auxiliary lens of the optical system is solely supported on the cooling framework so as to be cooled down. The infrared image detector is cooled down through a holding portion by another cooling portion filled with liquid nitrogen or the like.

SUMMARY OF THE INVENTION

The inventors have studied conventional photodetectors in detail and, and as a result, have found problems as follows. Namely, in the cooling type photodetector described in Reference 1, the annular cooling block surrounds and cools down indirectly the one end portion on the photoelectric surface side of the photomultiplier. This causes a poor cooling efficiency, and hence has a possibility that the occurrence of noise is not sufficiently suppressed in the photomultiplier. Further, the vacuum cell type light entrance window that is heated generates background light (thermal radiation), so that the background light is incident on the photomultiplier and can increase the dark current of the photomultiplier. This creates drawbacks in precision detection of weak light.

On the other hand, the infrared optical apparatus described in Reference 2 needs two separate systems of cooling means constituted by the cooling means comprising the cooling portion and the retaining portion for cooling the infrared image detector, and the auxiliary cooling means having the cooling device and the cooling framework for cooling the auxiliary lens of the optical system. This creates drawbacks in the size reduction of the apparatus configuration.

The invention has been devised in order to resolve these problems. An object of the invention is to provide a photodetector capable of detecting even weak light with precision and having a structure permitting size reduction.

The photodetector according to the present invention comprises a housing, a photoelectric tube accommodated in the housing, a heat conductive supporting member accommodated in the housing, and a cooling device accommodated in the housing and arranged between the heat conductive supporting member and an inner surface of the housing. The housing has a light entrance window for introducing light to be measured into inside thereof. The photoelectric tube has a light receiving faceplate and a photoelectric surface located on one surface of the light receiving faceplate. The heat conductive supporting member has a supporting protrusion piece for fixing the photoelectric tube, and the supporting protrusion piece has an aperture stop for introducing light to be measured, which is transmitted through the light entrance window of the housing, to the photoelectric surface of the photoelectric tube through the light receiving faceplate of the photoelectric tube. The cooling device has a heat radiating portion being in contact with the inner surface of the housing and a heat absorbing portion being in contact with the heat conductive supporting member. In particular, in the photodetector according to the present invention, it is preferable that the photoelectric tube is fixed only to the supporting protrusion piece while the light receiving faceplate of the photoelectric tube is aligned with the aperture stop.

In this case, when the cooling device begins cooling operation, the photoelectric tube is cooled down starting from the light receiving faceplate side via the supporting protrusion piece of the heat conductive supporting member fixed to the heat absorbing portion of the cooling device. At that time, the photoelectric tube is fixed only to the supporting protrusion piece, so that heat inflow through other members is prevented. Thus, the photoelectric surface of the photoelectric tube is efficiently cooled down through the light receiving faceplate by the cooling device serving as a cooling source, so that a stable cooling temperature is obtained. This suppresses the emission of thermal electrons from the photoelectric surface of the photoelectric tube, and hence sufficiently suppresses the occurrence of noise in the photoelectric tube. In this state, light to be measured, which is transmitted through the light entrance window of the housing, is incident on the photoelectric surface of the photoelectric tube via the aperture stop of the supporting protrusion piece, while background light emitted from the housing is shielded by the supporting protrusion piece around the aperture stop so as not to be incident on the photoelectric surface.

The photodetector according to the present invention may comprises a housing, a photoelectric tube accommodated in the housing, a heat conductive supporting member accommodated in the housing, a cooling device accommodated in the housing and arranged between the heat conductive supporting member and an inner surface of the housing, and an optical system for collecting light to be measured which is transmitted through the light entrance window of the housing. The housing has a light entrance window for introducing light to be measured into inside thereof. The photoelectric tube has a light receiving faceplate and a photoelectric surface located on one surface of the light receiving faceplate. The heat conductive supporting member has a supporting protrusion piece for fixing the photoelectric tube, and the supporting protrusion piece has an aperture stop for introducing light to be measured, which is transmitted through the light entrance window of the housing, to the photoelectric surface of the photoelectric tube through the light receiving faceplate of the photoelectric tube. The cooling device has a heat radiating portion being in contact with the inner surface of the housing and a heat absorbing portion being in contact with the heat conductive supporting member. The optical system has a lens barrel located between the light entrance window of the housing and the supporting protrusion piece of the heat conductive supporting member. In particular, in the photodetector according to the present invention, it is preferable that the photoelectric tube is fixed to one surface of the supporting protrusion piece of the heat conductive supporting member while the light receiving faceplate of the photoelectric tube is aligned with the aperture stop. Additionally, it is preferable that the lens barrel of the optical system is fixed to the other surface of the supporting protrusion piece of the heat conductive supporting member while the lens barrel of the optical system is aligned with the aperture stop.

In this case, when the cooling device begins cooling operation, the photoelectric tube is cooled down starting from the light receiving faceplate side via the supporting protrusion piece of the heat conductive supporting member fixed to the heat absorbing portion of the cooling device. At the same time, the optical system is cooled down together with the lens barrel. Thus, the photoelectric surface of the photoelectric tube is efficiently cooled down through the light receiving faceplate. This suppresses the emission of thermal electrons from the photoelectric surface, and hence sufficiently suppresses the occurrence of noise in the photoelectric tube. Further, the optical system is cooled down well, so that the generation of background light (thermal radiation) from the optical system is suppressed sufficiently. In this state, light to be measured that is transmitted through the light entrance window of the housing is collected on the photoelectric surface of the photoelectric tube via the aperture stop of the supporting protrusion piece by the optical system, while background light emitted from the housing is shielded by the supporting protrusion piece around the aperture stop so as not to be incident on the photoelectric surface.

Further, in the photodetector according to the present invention having the above-mentioned optical system, the photoelectric tube is preferably fixed only to one surface of the supporting protrusion piece of the heat conductive supporting member, while the light receiving faceplate of the photoelectric tube is aligned with the aperture stop.

In this case, when the cooling device begins cooling operation, the photoelectric tube is cooled down starting from the light receiving faceplate side via the supporting protrusion piece of the heat conductive supporting member fixed to the heat absorbing portion of the cooling device. At the same time, the optical system is cooled down together with the lens barrel. At that time, the photoelectric tube is fixed only to the supporting protrusion piece, so that heat inflow through other members is prevented. Thus, the photoelectric surface of the photoelectric tube is efficiently cooled down through the light receiving faceplate by the cooling device serving as a cooling source, so that a stable cooling temperature is obtained. This suppresses the emission of thermal electrons from the photoelectric surface of the photoelectric tube, and hence sufficiently suppresses the occurrence of noise in the photoelectric tube. Further, the optical system is cooled down well, so that the generation of background light (thermal radiation) from the optical system is suppressed sufficiently. In this state, light to be measured that is transmitted through the light entrance window of the housing is collected on the photoelectric surface of the photoelectric tube via the aperture stop of the supporting protrusion piece by the optical system, while background light emitted from the housing is shielded by the supporting protrusion piece around the aperture stop so as not to be incident on the photoelectric surface.

In the photodetector according to the present invention which has the above-mentioned optical system, it is preferable that the photoelectric tube is fixed only to one surface of the supporting protrusion piece of the heat conductive supporting member while the light receiving faceplate of the photoelectric tube is aligned with the aperture stop, and that the lens barrel of the optical system is fixed only to the other surface of the supporting protrusion piece of the heat conductive supporting member while the lens barrel of said optical system is aligned with the aperture stop.

In this case, when the cooling device begins cooling operation, the photoelectric tube is cooled down starting from the light receiving faceplate side via the supporting protrusion piece of the heat conductive supporting member fixed to the heat absorbing portion of the cooling device. At the same time, the optical system is cooled down together with the lens barrel. At that time, the photoelectric tube is fixed only to the supporting protrusion piece, so that heat inflow through other members is prevented. Thus, the photoelectric surface of the photoelectric tube is efficiently cooled down through the light receiving faceplate by the cooling device serving as a cooling source, so that a stable cooling temperature is obtained. This suppresses the emission of thermal electrons from the photoelectric surface of the photoelectric tube, and hence sufficiently suppresses the occurrence of noise in the photoelectric tube. Further, the optical system is fixed only to the supporting protrusion piece, so that heat inflow through other members is prevented. Thus, the optical system is efficiently cooled down by the cooling device serving as a cooling source, so that the generation of background light (thermal radiation) from the optical system is suppressed sufficiently. In this state, light to be measured that is transmitted through the light entrance window of the housing is collected on the photoelectric surface of the photoelectric tube via the aperture stop of the supporting protrusion piece by the optical system, while background light emitted from the housing is shielded by the supporting protrusion piece around the aperture stop so as not to be incident on the photoelectric surface.

In a photodetector according to the present invention, the photoelectric tube may be fixed in a state where the light receiving faceplate is in direct contact with the supporting protrusion piece, or alternatively, in a state where the light receiving faceplate is in contact with the supporting protrusion piece via an insulation plate arranged around the aperture stop. When the light receiving faceplate is in contact with the supporting protrusion piece via the insulation plate, variation in the electric potential of the light receiving faceplate is prevented so that the electric potential of the photoelectric surface is stabilized.

Since a high voltage is applied on the tube body of the photoelectric tube in some cases, it is preferable that an insulator is adhered to the periphery of the tube body of the photoelectric tube for easy handling. In particular, it is preferable that the insulator is composed of Teflon having good insulating property and a low gas release rate in vacuum.

In order to fix the photoelectric tube whose tube body is applied with a high voltage onto the supporting protrusion piece, it is preferable that a leaf spring-like stopper is supported on the supporting protrusion piece via an insulating support structure, so that the photoelectric tube is pressed against and fixed to the supporting protrusion piece by the stopper. In this case, when an insulator is adhered to the periphery of the tube bofy of the photoelectric tube, the insulation is preferably ensured doubly, together with the insulating support structure. When the insulator is composed of a tube formed of Teflon (a Teflon tube, hereafter), the stopper bites into the Teflon tube so as to preferably press securely the photoelectric tube against the supporting protrusion piece.

When the inner space of the housing is maintained in a vacuum state, heat inflow from the housing into the photoelectric tube is preferably prevented without using a heat insulating material. In this case, when the lens barrel of the optical system is provided with an opening for connecting between the inside and the outside of the lens barrel, and when the lens barrel is attached with a light shielding cover for covering the opening, the occurrence of dew condensation on the inner side surface of the condenser lens is prevented without degrading the light shielding function.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Figure 1:
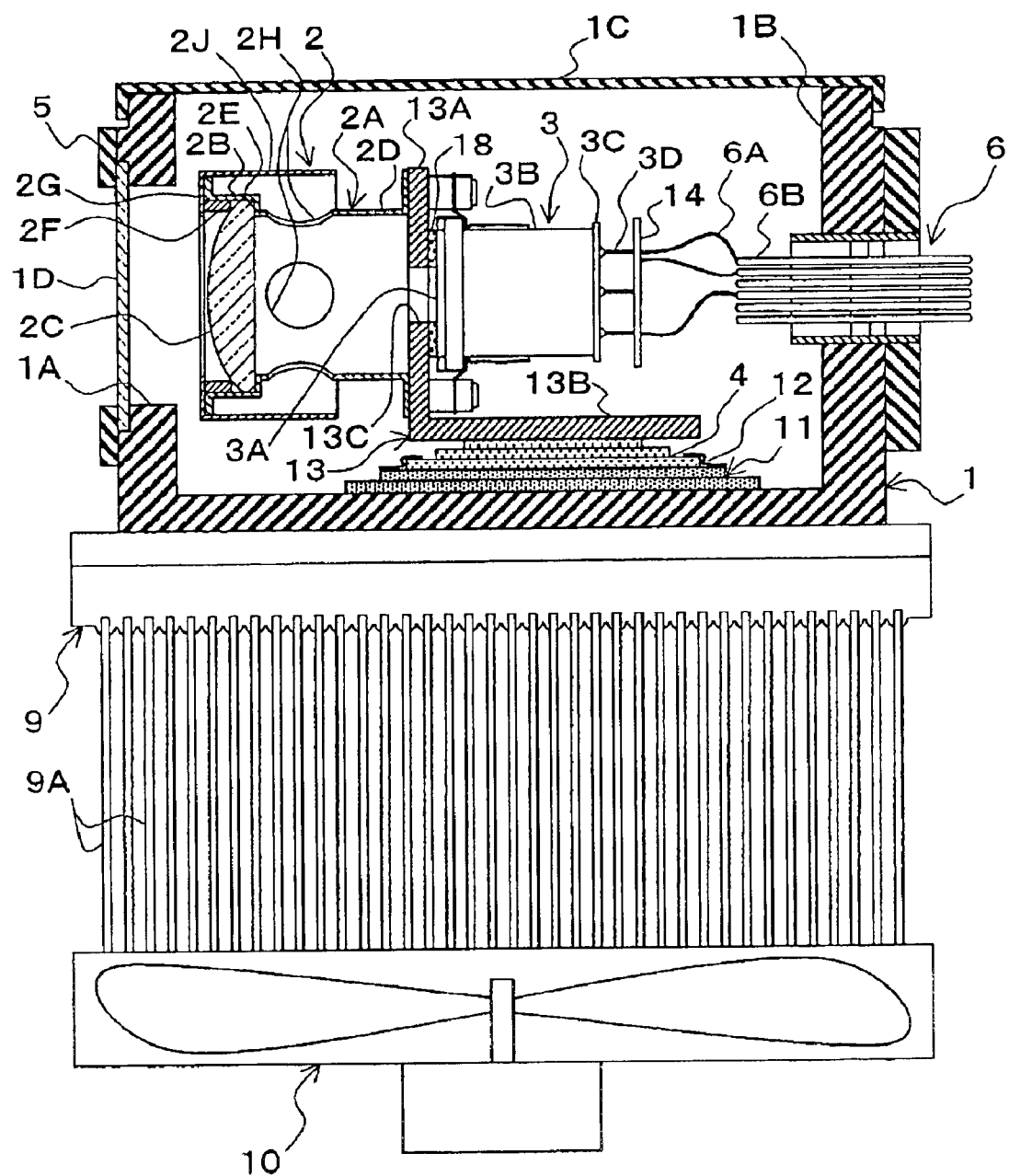
FIG. 1 is a cross sectional view showing the structure of one embodiment of a photodetector according to the present invention.
Figure 2:
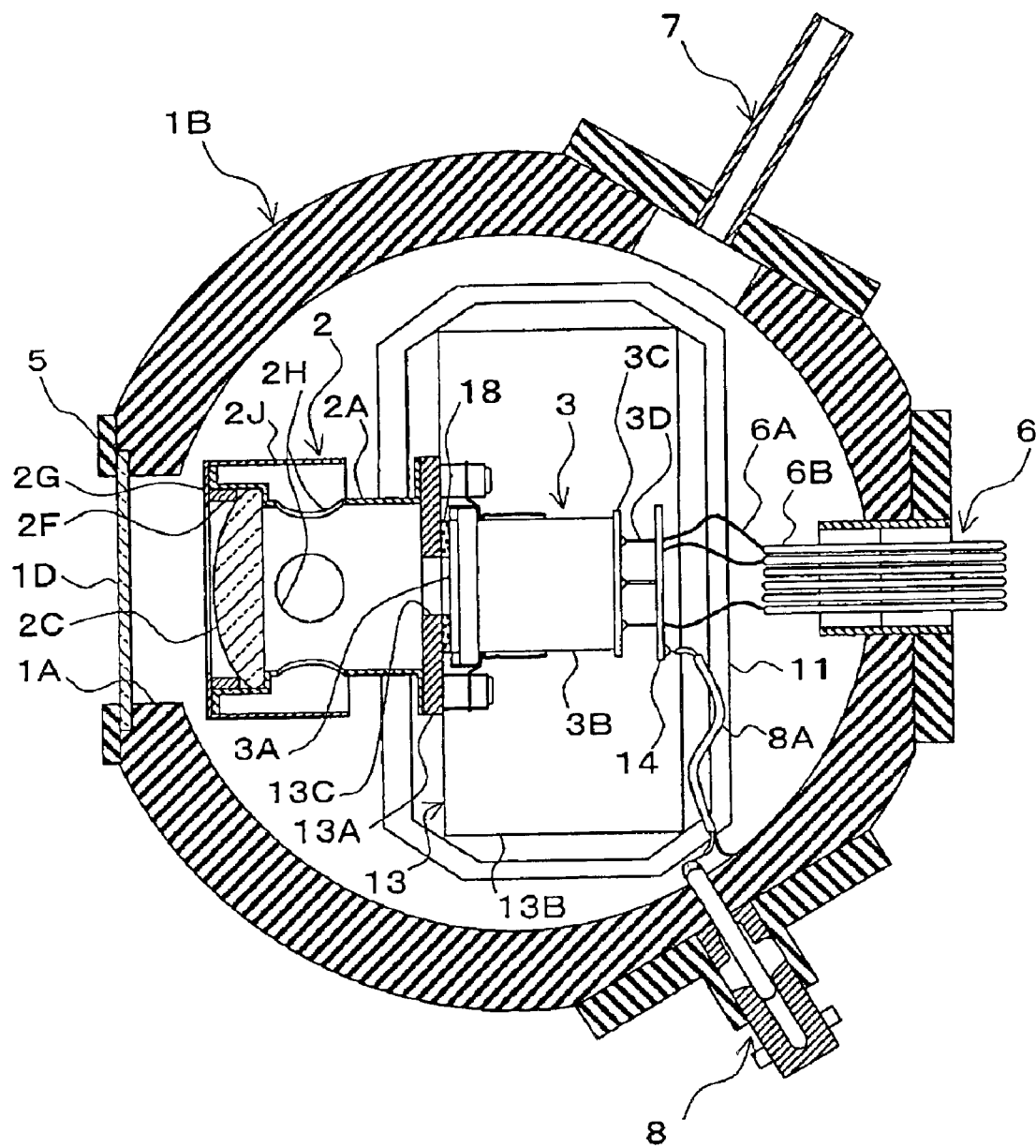
FIG. 2 is a horizontal cross sectional view of the housing shown in FIG. 1.
Figure 3:
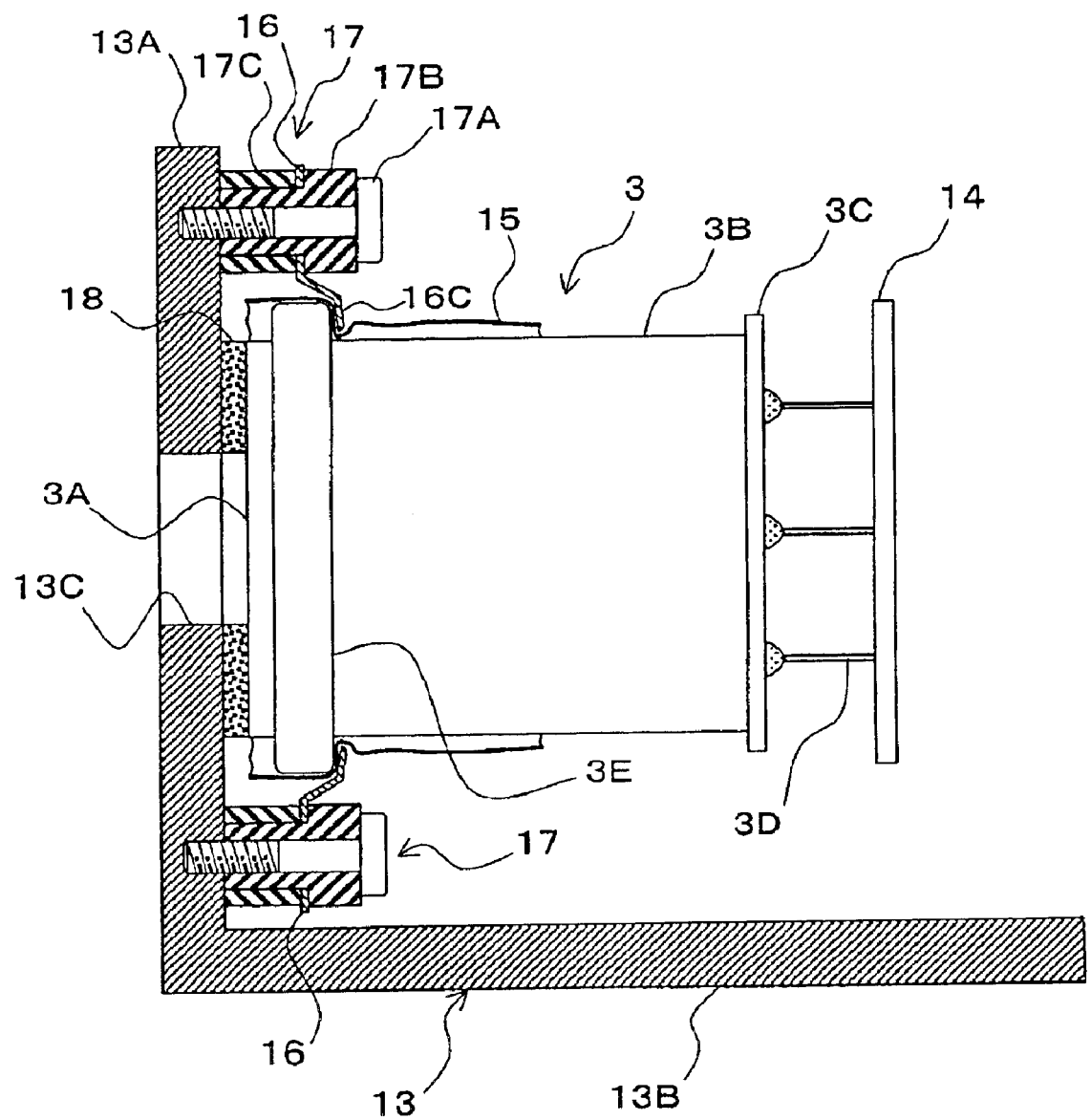
FIG. 3 is an enlarged view showing the structure, shown in FIG. 1, for fixing the photoelectric tube to the heat conductive supporting member.

Embodiments of a cooling type photodetector according to the present invention are described below with reference to the drawings. In the drawings to be referred to, FIG. 1 is a cross sectional view showing the structure of one embodiment of a cooling type photodetector according to the present invention. FIG. 2 is a horizontal cross sectional view of the housing shown in FIG. 1. FIG. 3 is an enlarged view showing the structure, shown in FIG. 1, for fixing the photoelectric tube to the heat conductive supporting member.

The photodetector according to an embodiment shown in FIG. 1 is a cooling type photodetector, for example, capable of detecting even weak light in the near infrared range. A housing 1 provided with a light entrance window 1A for introducing light to be measured toward the inner space thereof accommodates an optical system 2 for collecting the light to be measured, a photoelectric tube 3 for detecting the light to be measured collected by the optical system 2 as an electric signal, and a cooling device 4 for cooling the optical system 2 and the photoelectric tube 3 so as to improve the detection performance for the light to be measured.

The housing 1 is a vacuum chamber in which a chamber cover 1C is attached to the opening portion of a cylindrical chamber body 1B of envelope type as shown in FIG. 1 and FIG. 2, in an air-tight manner using a seal ring. The side wall of the chamber body 1B is provided with the light entrance window 1A at a position where the light entrance window 1A faces the optical system 2. On the outer side of the light entrance window 1A, a transparent window material 1D pressed against the chamber body 1B by a flange 5 is attached in an air-tight manner using a seal ring.

Further, on the wall of the chamber body 1B, an air-tight connector 6 having a plurality of lead pins 6B connected through lead wires 6A to the photoelectric tube 3, an evacuating duct 7 for evacuating the inside of the housing 1, and an air-tight signal connector 8 connected through a coaxial cable 8A to the photoelectric tube 3 in order to lead the signal of the photoelectric tube 3 to the outside of the housing 1 are attached in an air-tight manner using a seal ring. The inner space of the housing 1 is evacuated through the evacuating duct 7 so as to be maintained in a vacuum state.

The chamber body 1B is composed of a highly heat conductive metallic material such as an aluminum alloy and a copper alloy, and a heat sink 9 having a plurality of heat radiating fins 9A arranged in parallel to each other is attached to the outer bottom surface of the chamber body 1B in a state of surface contact. The heat sink 9 is attached with a cooling fan 10 for causing cooling air to flow through the gaps between a plurality of the heat radiating fins 9A.

On the other hand, on the inner bottom surface of the chamber body 1B, a base member 11 composed of the same metallic material as the chamber body 1B is fixed by means of a screw or the like. The cooling device 4 is pressed against and fixed onto the base member 11 by a leaf spring-like stopper 12.

The cooling device 4 is composed of a Peltier element which expresses a Peltier effect on the basis of an electric current supplied from an external temperature controller, so that a heat absorbing portion corresponding to one surface becomes cool while a heat radiating portion corresponding to the other surface becomes hot. The cooling device 4 shown in the figures, in order to multiply the cooling function, is constituted by three Peltier sub-elements stacked into a three-stage configuration in which the heat radiating portion of an element contacts with the heat absorbing portion of the adjacent element. The cooling device 4 constituted by this three-stage Peltier element is fixed onto the base member 11 in a state where the heat radiating portion is pressed against the base member 11.

A heat conductive supporting member 13 having a supporting protrusion piece 13A for fixing the optical system 2 and the photoelectric tube 3 is fixed to the heat absorbing portion of the cooling device 4. The heat conductive supporting member 13 is composed of a highly heat conductive metallic material such as an aluminum alloy and a copper alloy, and formed in the L-shape in the side view where the supporting protrusion piece 13A protrudes approximately at right angles from the end portion of a fixing piece 13B in surface contact with the heat absorbing portion of the cooling device 4 (see FIG. 3).

An aperture stop 13C for introducing light to be measured that is transmitted through the light entrance window 1A opened in the chamber body 1B of the housing 1 to be introduced through a light receiving faceplate 3A of the photoelectric tube 3 to a photoelectric surface is provided on the supporting protrusion piece 13A of the heat conductive supporting member 13 (see FIG. 3). The aperture stop 13C has a predetermined diameter capable of shielding background light emitted from the chamber body 1B around the light entrance window 1A.

One end portion of a lens barrel 2A of the optical system 2 for causing the light to be measured that is transmitted from the light entrance window 1A to be collected on the aperture stop 13C is fixed to the outer side surface of the supporting protrusion piece 13A having the aperture stop 13C facing the light entrance window 1A, using a screw while the one end portion is aligned concentrically with the aperture stop 13C. Further, one end portion on the light receiving faceplate 3A side of the photoelectric tube 3 is fixed to the inner side surface of the supporting protrusion piece 13A while the one end portion is aligned concentrically with the aperture stop 13C.

In the optical system 2, a large diameter portion 2B in the other end portion of the lens barrel 2A composed of a highly heat conductive metallic material such as an aluminum alloy and a copper alloy accommodates a condenser lens 2C. The inner side surface of the condenser lens 2C abuts against a step portion 2E from the larger diameter portion 2B to a small diameter portion 2D of the lens barrel 2A, while a spacer ring 2F is arranged in the periphery of the outer side surface of the condenser lens 2C. An engaging ring 2G screwed to the opening end portion of the larger diameter portion 2B of the lens barrel 2A abuts against and engages the spacer ring 2F, so that the condenser lens 2C is held at a predetermined position in the larger diameter portion 2B.

The inner diameter of the engaging ring 2G is set such that the light to be measured passing through in the periphery of the inner diameter is collected by the condenser lens 2C so as to pass through in the periphery of the inner diameter of the aperture stop 13C of the supporting protrusion piece 13A.

In order to prevent the occurrence of dew condensation on the inner side surface of the condenser lens 2C due to the cooling of the optical system 2, an opening 2H for connecting between the inside and the outside of the lens barrel 2A is formed in the small diameter portion 2D in the vicinity of the larger diameter portion 2B of the lens barrel 2A. Then, a tube-shaped light shielding cover 2J for surrounding and covering the vicinity of the opening 2H is integrally provided in the engaging ring 2G.

As shown in FIG. 3, the photoelectric tube 3 is composed of a metal package head-on type PMT (photomultiplier) in which a light receiving faceplate 3A composed of silica glass or the like is attached to one end portion of a cylindrical tube body 3B composed of metal, while a stem plate 3C is attached to the other end portion of the tube body 3B. The photoelectric tube 3 comprises a photoelectric surface formed on the back surface of the light receiving faceplate 3A a dynode section built inside the tube body 3B, and the like, so as to be capable of detecting even weak light in the near infrared range as an electric signal.

In order to control the voltage applied to the photoelectric tube 3 from the outside of the housing 1, a plurality of stem pins 3D protruding from the stem plate 3C are connected to a thick-film resistor substrate 14, and a plurality of lead pins 6B of the air-tight connector 6 are connected through the lead wires 6A to the thick-film resistor substrate 14, as shown in FIG. 1 and FIG. 2. Further, in order to lead the detection signal of the photoelectric tube 3 to the outside of the housing 1, the air-tight signal connector 8 is connected through the coaxial cable 8A to the thick-film resistor substrate 14.

As shown in FIG. 3, a flange portion 3E with a large diameter is formed on one end portion of the tube body 3B of the photoelectric tube 3, in the vicinity of the light receiving faceplate 3A. In some cases, a high voltage of 1,000 V or the like is applied on the tube body 3B of the metal package photoelectric tube 3. Thus, for easy handling of the photoelectric tube 3, an insulating Teflon tube 15 is attached to the outer periphery of the tube body 3B including the flange portion 3E. This Teflon tube 15 is treated by heat so as to shrink and fit closely to the flange portion 3E and the tube body 3B.

In order to fix the photoelectric tube 3 whose tube body 3B is applied with a high voltage on to the supporting protrusion piece 13A of the heat conductive supporting member 13 while maintaining an insulated state, a plurality of leaf spring-like stoppers 16 composed of a stainless steel plate or the like are supported on the inner side surface of the supporting protrusion piece 13A each via an insulating support structure 17.

Figure 4:
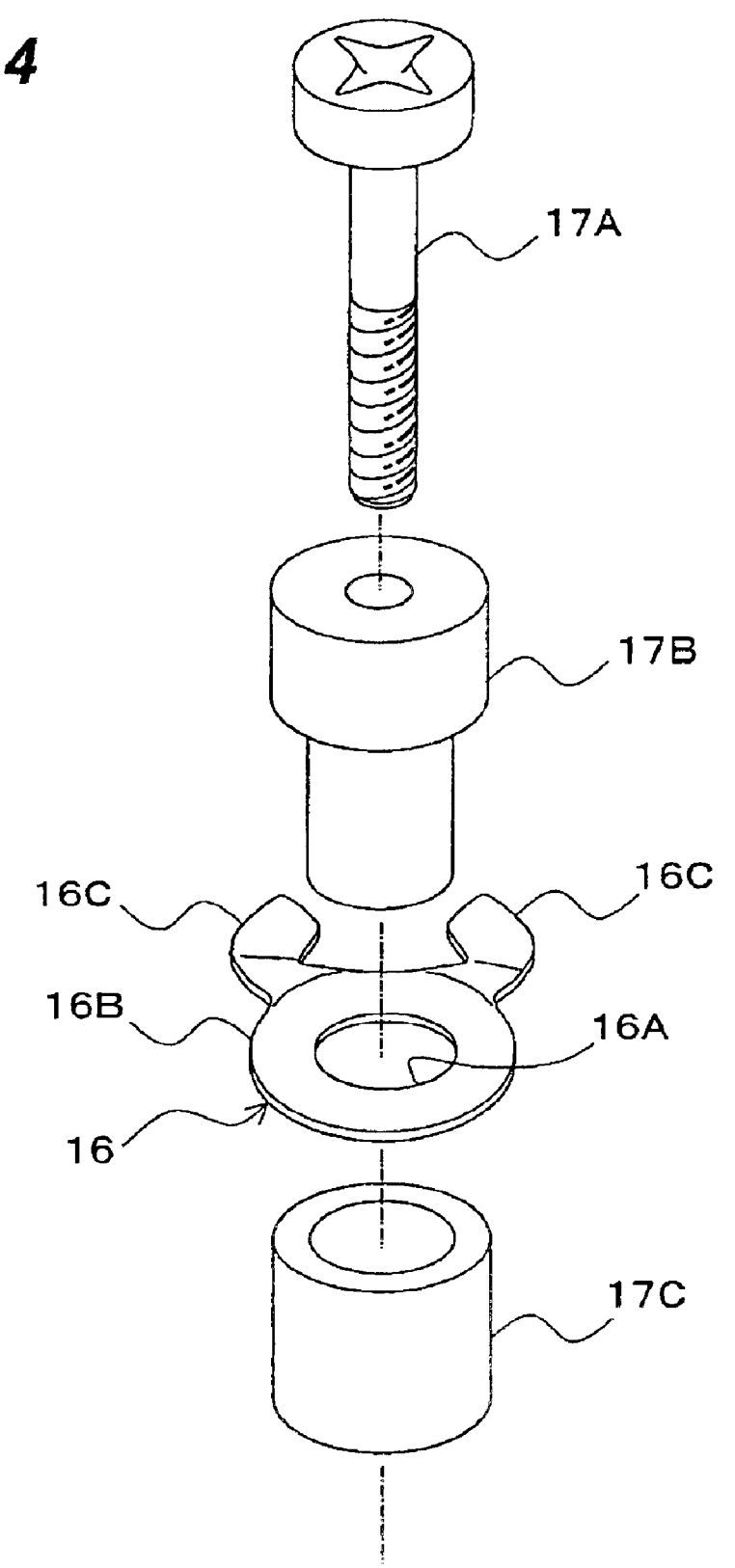
FIG. 4 is an exploded perspective view showing the stopper and the insulating support structure shown in FIG. 3.

As shown in FIG. 4, the stopper 16 has a plan shape such that a pair of right and left engaging claws 16C protrude from a washer-like fixing piece 16B having an attachment aperture 16A, with a right-left symmetry. The pair of engaging claws 16C are bent and inclined relative to the fixing piece 16B so as to engage elastically the flange portion 3E with the large diameter (see FIG. 3) of the photoelectric tube 3 so as to press the flange portion 3E against the supporting protrusion piece 13A.

The insulating support structure 17 comprises a setscrew 17A screwed into and fixed to the supporting protrusion piece 13A, a stepped insulating collar 17B composed of ceramic fitted around the screw portion of the setscrew 17A in a state where the large diameter portion of the collar is oriented to the head of the setscrew 17A, and an insulating collar 17C composed of ceramic fitted around the outer periphery of the small diameter portion of the stepped insulating collar 17B. In the insulating support structure 17, the attachment aperture 16A of the stopper 16 and the insulating collar 17C are sequentially fitted around the small diameter portion of the stepped insulating collar 17B, and then the setscrew 17A is screwed into and fixed to the supporting protrusion piece 13A, so that the fixing piece 16B of the stopper 16 is clamped between the end surface of the larger diameter portion of the stepped insulating collar 17B and the end surface of the insulating collar 17C. As a result, the stopper 16 is supported in an insulated state (see FIG. 3).

As shown in FIG. 3, the insulating support structures 17 in each of which the stopper 16 is supported in an insulated state are arranged, for example, at four positions at equal spaces around a circle concentric with the aperture stop 13C of the supporting protrusion piece 13A. Then, a pair of right and left engaging claws 16C of the stopper 16 supported by each insulating support structure 17 press the flange portion 3E of the photoelectric tube 3 against the supporting protrusion piece 13A via the Teflon tube 15, so that the photoelectric tube 3 is fixed to the supporting protrusion piece 13A in an insulated state.

A ring-shaped insulation plate 18 is arranged around the aperture stop 13C in the inner side surface of the supporting protrusion piece 13A, so that the light receiving faceplate 3A of the photoelectric tube 3 is pressed against the inner side surface of the supporting protrusion piece 13A via the ring-shaped insulation plate 18. The insulation plate 18 is provided as an inserted member for helping the insulating property of the light receiving faceplate 3A composed of silica glass, and hence is composed of an insulating material having a good thermal conductivity such as AlN (aluminum nitride). Further, in order to improve the thermal conductivity between the supporting protrusion piece 13A and the light receiving faceplate 3A, both surfaces of the insulation plate 18 are polished so as to fit closely to the inner side surface of the supporting protrusion piece 13A and the surface of the light receiving faceplate 3A.

The photodetector according to the present invention having the above-mentioned configuration is used for detecting light to be measured, for example, in a range from visible to near infrared. In the use of the photodetector, when a driving current is supplied from the temperature controller to the cooling device 4 in the housing 1, the cooling device 4 of FIG. 1 exerts a Peltier effect, so that the heat absorbing portion becomes cool while the heat radiating portion becomes hot. Then, the heat transmitted from the heat radiating portion of the cooling device 4 through the chamber body 1B of the housing 1 to the heat sink 9 is radiated from the heat radiating fins 9A cooled forcedly by the cooling fan 10, so that the temperature of the heat absorbing portion of the cooling device 4 is maintained at a low temperature whereby the heat absorbing operation is continued.

Since the heat absorbing operation is continued in the heat absorbing portion of the cooling device 4, the heat conductive supporting member 13 contacted with the heat absorbing portion is cooled down, so that the optical system 2 and the photoelectric tube 3 fixed to the supporting protrusion piece 13A are cooled down simultaneously.

The entirety of the optical system 2 including the condenser lens 2C, the spacer ring 2F, the engaging ring 2G, and the light shielding cover 2J is cooled down to almost the same temperature via the lens barrel 2A one end portion of which is fixed to the supporting protrusion piece 13A. On the other hand, in the photoelectric tube 3, the light receiving faceplate 3A is cooled down via the insulation plate 18 fitted closely to the supporting protrusion piece 13A, and then the entirety is cooled down from the light receiving faceplate 3A via the tube body 3B.

At that time, the photoelectric tube 3 is fixed only to the supporting protrusion piece 13A of the heat conductive supporting member 13, so that heat inflow through other members is prevented. Thus, the photoelectric tube 3 is cooled down efficiently at a stable temperature by the cooling device 4 serving as a cooling source the cooling temperature of which is controlled by the temperature controller. In other words, the photoelectric surface is cooled down efficiently at a stable temperature via the light receiving faceplate 3A of the photoelectric tube 3. This suppresses the emission of thermal electrons from the photoelectric surface of the photoelectric tube 3, and hence sufficiently suppresses the occurrence of noise.

Similarly, the optical system 2 is fixed only to the supporting protrusion piece 13A of the heat conductive supporting member 13, so that heat inflow through other members is prevented. Thus, the optical system 2 is cooled down efficiently at a stable temperature by the cooling device 4 serving as a cooling source. In other words, the entirety of the optical system 2 including the lens barrel 2A, the condenser lens 2C, the spacer ring 2F, the engaging ring 2G, and the light shielding cover 2J is cooled down efficiently at a stable temperature, so that the generation of background light (thermal radiation) from the optical system 2 is suppressed sufficiently.

In the photodetector according to an embodiment, as shown in FIG. 1 and FIG. 2, light to be measured including near-infrared light is transmitted through the window material 5 attached to the chamber body 1B of the housing 1 and through the light entrance window 1A into the optical system 2. The light to be measured is collected on the aperture stop 13C of the supporting protrusion piece 13A by the condenser lens 2C of the optical system 2, and then incident through the light receiving faceplate 3A of the photoelectric tube 3 onto the photoelectric surface corresponding to the back surface of the photoelectric tube 3. At that time, background light (thermal radiation) emitted from the housing 1 is shielded by the supporting protrusion piece 13A around the aperture stop 13C, so as not to be incident on the photoelectric surface.

As such, in the photodetector according to the present invention, background light (thermal radiation) emitted from the housing 1 is shielded, while the generation of background light (thermal radiation) from the optical system 2 is suppressed sufficiently, and while the emission of thermal electrons from the photoelectric surface of the photoelectric tube 3 is suppressed so that the occurrence of noise is suppressed. In this state, the light to be measured is detected as an electric signal by the photoelectric tube 3. Accordingly, the photodetector according to the present invention improves notably the precision in the detection of the light to be measured, and hence realizes the precision detection of even weak light in the near infrared range.

Also, in this configuration, the optical system 2 and the photoelectric tube 3 are fixed to the supporting protrusion piece 13A of the heat conductive supporting member 13 fixed to the heat absorbing side of the cooling device 4, so as to be cooled down simultaneously. Accordingly, when the temperature of the cooling device 4 is controlled by the single temperature controller, the optical system 2 and the photoelectric tube 3 are controlled simultaneously at an appropriate temperature. Further, a single cooling system including the temperature controller, the cooling device 4, and the heat conductive supporting member 13 is sufficient for this configuration. This permits a size reduction and cost reduction of the photodetector.

Furthermore, in the structure of fixing the photoelectric tube 3 to the supporting protrusion piece 13A of the heat conductive supporting member 13, the insulation plate 18 is inserted between the light receiving faceplate 3A of the photoelectric tube 3 and the supporting protrusion piece 13A. By virtue of this, even when a high voltage is applied to the tube body 3B of the photoelectric tube 3, fluctuation in the electric potential of the light receiving faceplate 3A is prevented so that the electric potential of the photoelectric surface is stabilized.

The insulating Teflon tube 15 is adhered to the outer periphery of the tube body 3B of the photoelectric tube 3. This improves the ease in handling of the photoelectric tube 3 in a case where a high voltage is applied to the tube body 3B. At the same time, the engaging claw 16C of the stopper 16 supported by the insulating support structure 17 bites into the Teflon tube 15, so that the stopper 16 presses securely the photoelectric tube 3 against the supporting protrusion piece 13A.

The inside of the housing 1 is maintained in a vacuum state. This eliminates the necessity of a heat insulating material for preventing heat inflow from the housing 1 into the photoelectric tube 3. In this case, the lens barrel 2A of the optical system 2 is provided with the opening 2H for connecting between the inside and the outside of the lens barrel 2A. This prevents the occurrence of dew condensation on the inner side surface of the condenser lens 2C. Further, the opening 2H is covered with the light shielding cover 2J, so that the light shielding function of the lens barrel 2A is not degraded.

Figure 5:
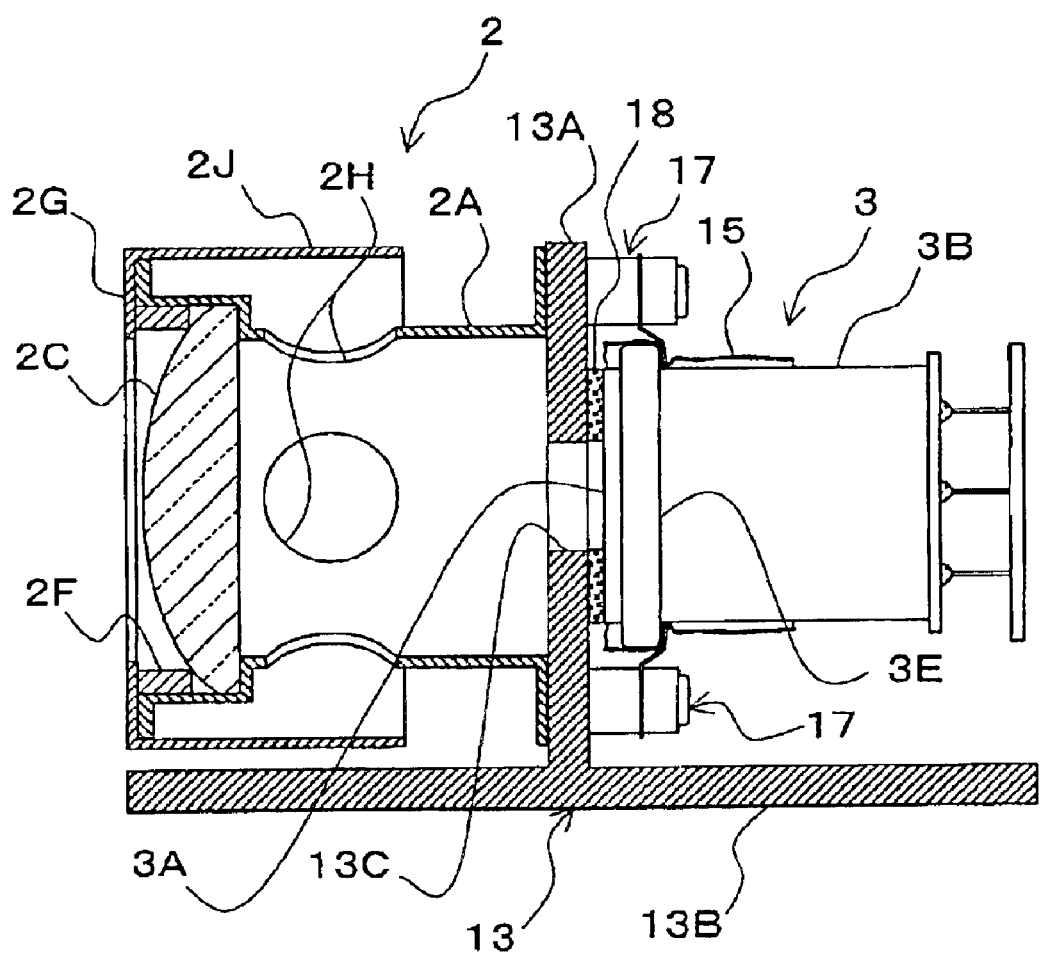
FIG. 5 is a cross sectional view showing a modification for the heat conductive supporting member shown in FIG. 3.

The photodetector according to the present invention is not limited to merely the above-mentioned embodiment. For example, the heat conductive supporting member 13 for fixing and cooling the optical system 2 and the photoelectric tube 3 (see FIG. 3) may be formed in the T-shape in the side view as shown in FIG. 5 where a supporting protrusion piece 13A protrudes approximately at right angles from the middle portion of a fixing piece 13B. In this case, the heat conductive supporting member 13 is arranged such that the supporting protrusion piece 13A is positioned at the center portion of the housing 1. This allows the optical system 2 and the photoelectric tube 3 to be arranged with good balance inside the housing 1.

The insulation plate 18 inserted between the supporting protrusion piece 13A of the heat conductive supporting member 13 and the light receiving faceplate 3A of the photoelectric tube 3 is not limited to a contiguous ring shape, and may be composed of a plurality of plate pieces arranged in a ring shape. Further, the insulation plate 18 is not indispensable, and can be omitted.

The photoelectric tube 3 is not limited to a PMT (photomultiplier) having a dynode. For example, the photoelectric tube 3 may composes an MCP-PMT (micro channel plate built-in photomultiplier) having an electric field assisted photoelectron emitting surface.

As described above, in the photodetector according to the present invention, the photoelectric tube is cooled down starting from the light receiving faceplate side via the supporting protrusion piece of the heat conductive supporting member by the heat absorbing operation of the cooling device. At that time, the photoelectric tube is fixed only to the supporting protrusion piece, so that heat inflow through other members is prevented. Thus, the photoelectric surface is efficiently cooled down through the light receiving faceplate by the cooling device serving as a cooling source, so that a stable cooling temperature is obtained. This suppresses the emission of thermal electrons from the photoelectric surface, and hence sufficiently suppresses the occurrence of noise in the photoelectric tube. In this state, light to be measured that is transmitted through the light entrance window of the housing is incident on the photoelectric surface of the photoelectric tube via the aperture stop of the supporting protrusion piece, and therefore background light emitted from the housing is shielded by the supporting protrusion piece around the aperture stop so as not to be incident on the photoelectric surface. Accordingly, the photodetector according to the present invention improves the detection precision, and hence realizes precision detection of even weak light. Further, the heat conductive supporting member fixed to the heat absorbing portion of the cooling device simplifies the configuration of the cooling system, and hence permits size reduction.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A photodetector comprising:
   a housing with a light entrance window;
   a photoelectric tube accommodated in said housing, said photoelectric tube having a light receiving faceplate and a photoelectric surface located on one surface of the light receiving faceplate;
   a heat conductive supporting member accommodated in said housing, said heat conductive supporting member having a supporting protrusion piece for fixing said photoelectric tube; and
   a cooling device accommodated in said housing and arranged between said heat conductive supporting member and an inner surface of said housing, said cooling device having a heat radiating portion being in contact with the inner surface of said housing and a heat absorbing portion being in contact with said heat conductive supporting member,
   wherein the supporting protrusion piece of said heat conductive supporting member has an aperture stop for introducing light to be measured, which is transmitted through the light entrance window of said housing, to the photoelectric surface of said photoelectric tube through the light receiving faceplate of said photoelectric tube, and
   wherein said photoelectric tube is fixed only to the supporting protrusion piece of said heat conductive supporting member, while the light receiving faceplate of said photoelectric tube is aligned with the aperture stop.

2. A photodetector according to claim 1, wherein the light receiving faceplate of said photoelectric tube is in direct contact with the supporting protrusion piece of said heat conductive supporting member.

3. A photodetector according to claim 1, wherein the light receiving faceplate of said photoelectric tube is in contact with the supporting protrusion piece of said heat conductive supporting member via an insulation plate arranged around the aperture stop.

4. A photodetector according to claim 1, wherein an insulator is adhered to the outer periphery of the tube body of said photoelectric tube.

5. A photodetector according to claim 4, wherein the insulator is composed of Teflon.

6. A photodetector according to claim 1, wherein a leaf spring-like stopper is supported on the supporting protrusion piece of said heat conductive supporting member via an insulating support structure, so that said photoelectric tube is pressed against and fixed to the supporting protrusion piece of said heat conductive supporting member by the stopper.

7. A photodetector according to claim 1, wherein an inner space of said housing is maintained in a vacuum state.

8. A photodetector comprising:
   a housing with a light entrance window;
   a photoelectric tube accommodated in said housing, said photoelectric tube having a light receiving faceplate and a photoelectric surface located on one surface of the light receiving faceplate;
   a heat conductive supporting member accommodated in said housing, said heat conductive supporting member having a supporting protrusion piece for fixing said photoelectric tube;

a cooling device accommodated in said housing and arranged between said heat conductive supporting member and an inner surface of said housing, said cooling device having a heat radiating portion being in contact with the inner surface of said housing and a heat absorbing portion being in contact with said heat conductive supporting member; and an optical system for collecting light to be measured that is transmitted through the light entrance window of said housing, said optical system having a lens barrel located between the light entrance window of said housing and the supporting protrusion piece of said heat conductive supporting member, wherein the supporting protrusion piece of said heat conductive supporting member has an aperture stop for introducing light to be measured, which is transmitted through the light entrance window of said housing, to the photoelectric surface of said photoelectric tube through the light receiving faceplate of said photoelectric tube, wherein said photoelectric tube is fixed to one surface of the supporting protrusion piece of said heat conductive supporting member, while the light receiving faceplate of said photoelectric tube is aligned with the aperture stop, and wherein the lens barrel of said optical system is fixed to the other surface of the supporting protrusion piece of said heat conductive supporting member, while the lens barrel of said optical system is aligned with the aperture stop.

9. A photodetector according to claim 8, wherein said photoelectric tube is fixed only to one surface of the supporting protrusion piece of said heat conductive supporting member, while the light receiving faceplate of said photoelectric tube is aligned with the aperture stop.

10. A photodetector according to claim 8, wherein said photoelectric tube is fixed only to one surface of the supporting protrusion piece of said heat conductive supporting member, while the light receiving faceplate of said photoelectric tube is aligned with the aperture stop, and wherein the lens barrel of said optical system is fixed only to the other surface of the supporting protrusion piece of said heat conductive supporting member, while the lens barrel of said optical system is aligned with the aperture stop.

11. A photodetector according to claim 8, wherein the light receiving faceplate of said photoelectric tube is in direct contact with the supporting protrusion piece of said heat conductive supporting member.

12. A photodetector according to claim 8, wherein the light receiving faceplate of said photoelectric tube is in contact with the supporting protrusion piece of said heat conductive supporting member via an insulation plate arranged around the aperture stop.

13. A photodetector according to claim 8, wherein an insulator is adhered to the outer periphery of the tube body of said photoelectric tube.

14. A photodetector according to claim 13, wherein the insulator is composed of Teflon.

15. A photodetector according to claim 8, wherein a leaf spring-like stopper is supported on the supporting protrusion piece of said heat conductive supporting member via an insulating support structure, so that said photoelectric tube is pressed against and fixed to the supporting protrusion piece of said heat conductive supporting member by the stopper.

16. A photodetector according to claim 8, wherein an inner space of said housing is maintained in a vacuum state.

* * * * *